(12) United States Patent
Xu et al.

(10) Patent No.: US 6,476,398 B1
(45) Date of Patent: Nov. 5, 2002

(54) BEAM AUTOMATION IN CHARGED-PARTICLE-BEAM SYSTEMS

(75) Inventors: Li Xu, Santa Clara, CA (US); Richard Barnard, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/514,080

(22) Filed: Feb. 26, 2000

Related U.S. Application Data

(60) Provisional application No. 60/123,092, filed on Mar. 5, 1999.

(51) Int. Cl.[7] .............................. G21K 1/08; H01J 3/14
(52) U.S. Cl. ................................... 250/396 R
(58) Field of Search ..................... 250/396 R

(56) References Cited

U.S. PATENT DOCUMENTS 4,510,384 A    4/1985  Grimbleby et al.

OTHER PUBLICATIONS

S.J. Erasmus et al., An automatic focuing and astigmatism correction system for the SEM and CTEM, Journal of Microscopy, vol. 127, Pt. 2, Aug. 1982, pp. 185–199.

K.H. Ong, A Robust Focusing and Astigmatism Correction Method for the Scanning Electron Microscope, Scanning, vol. 19 No. 8 (1977).

W.H. Press et al., Numerical Recipes in C: The Art of Scientific Computing, Second Edition, Cambridge University Press, 1992, pp. 116–119, pp. 396–401 and pp. 612–613.

M.T. Postek et al., SEM Performance Evaluation using the Sharpness Criterion, SPIE, vol. 2725, pp. 504–514 (1996).

W.J. Tee et al., An automatic focusing and stigmating system for the SEM, J. Phys. E: Sci. Instrum. 12 (1977), pp. 35–38.

*Primary Examiner*—Jack Berman
*Assistant Examiner*—Johnnie L Smith
(74) *Attorney, Agent, or Firm*—Bruce D. Riter

(57) ABSTRACT

Embodiments in accordance with the invention provide respectively for auto-focus, auto-contrast, and auto-correction of astigmatism in both x and y directions, are independent of focus-induced-image-rotation, sample feature orientation and image deformation, and focus-induced-image magnification change, and are insensitive to various kinds of noise. Poor image contrast is handled by an auto-contrast capability. Embodiments in accordance with the invention can achieve high reliability and repeatability, while providing for faster operation than most prior-art methods.

44 Claims, 15 Drawing Sheets

BEAM AUTOMATION IN CHARGED-PARTICLE-BEAM SYSTEMS

Priority under 35 USC §119(e) of U.S. provisional application No. 60/123,092, filed Mar. 5, 1999 is hereby claimed, and the content of U.S. provisional application No. 60/123,092, filed Mar. 5, 1999 is incorporated herein by this reference.

BACKGROUND OF THE INVENTION

1. Field of the Invention

The invention relates to automation of charged-particle-beam system operations, in particular focusing, contrast setting and astigmatism corrections.

2. The Prior Art

As in optical microscopes, focus, contrast and astigmatism correction are fundamental to imaging in charged-particle-beam systems such as scanning-electron-microscope (SEM) systems and focused-ion-beam (FIB) systems. As the semiconductor diagnostics industry develops, the microscope systems are automated, and so are the focus, contrast and astigmatism correction. However, it is a lot more difficult to perform these beam automation tasks in charged-particle-beam systems than in other optical systems. Since the early 1970's, a number of attempts have been made to achieve auto-focus and auto-correction of astigmatism. None of these has proven adequate in terms of reliability, speed, accuracy and repeatability. Better solutions are therefore needed.

Difficulties in charged-particle-beam system automation have many causes. Typically these include:

focus variation in run time due to column contamination, current drift, inspected sample navigation, etc.

imaging interdependence between focus, x-astigmatism and y-astigmatism, lens alignment, etc., although the settings are independent poor image contrast, including saturation and low contrast contrast variation at various focus positions sample feature orientation feature density over the image image rotation as focus varies (the rotation angle could be up to 90 degrees), defined herein as "focus-induced-image-rotation" ("FIIR")

image rotation center moves as focus varies image size or magnification change as focus varies image deformation including changes in aspect ratio and orthogonality rolling wave noise, shot noise, synchronization noise, and other kinds of uneven patterned noise poor electron gun alignment Of all the factors in the above, FIIR, poor contrast, sample feature orientation variation, magnification change, and deformation are the worst obstacles to achieving good-quality beam automation. All the existing techniques mentioned below are vulnerable to these obstacles. As a result, measurements performed with the existing techniques are often not reliable and repeatable.

Auto-focus, auto-correction of astigmatism, and auto-contrast have long been issues existing in charged-particle-beam systems. Prior-art techniques used to address these issues include one-dimensional fast-Fourier transform (1-D FFT), two-dimensional fast-Fourier transform (2-D FFT), power spectrum analysis, maximizing the intensity gradient, profile analysis, polar line gradient, variance of differences, etc. These methods fall into the following categories: FFT, power spectrum, maximum gradient, and variance of differences.

Weak points of the prior techniques are in general:

The ways of measuring focus goodness and astigmatism are in many situations unstable.

The search paths are not optimized

FIG. 1 shows one general procedure of auto-focus in these prior methods. An image with good edges is selected (step 105). The focus is set at a starting position (110). The image is acquired (step 115). The image is processed to determine a value representing a goodness index (GI) of focus (step 120). The focus is then changed by one step (step 125). Steps 115–125 are repeated for N times (step 130). After N repetitions, the largest index of focus value is found through comparison (step 135). Finally, the charged-particle-beam system is set at the corresponding focus (step 140).

Another procedure of auto-focus is shown in FIG. 2. In its data processing, Fast-Fourier transform (FFT) method is used as in step 120. The procedure starts by reading the current focus position F (step 205). Using an offset $\Delta F$, the system focus is set at $F+\Delta F$ (step 210). An image is captured, then processed using FFT (step 215). The image is thresholded using pre-set criteria. Count the pixel numbers above the criteria as P, $P=P(F+\Delta F)$ (step 220). Repeat the above to get $P=P(F-\Delta F)$ (steps 225–235). Compare $P(F+\Delta F)$ and $P(F-\Delta F)$. If $P(F+\Delta F)>P(F-\Delta F)$, then F is increased to $F+\Delta F$. Otherwise, F is decreased to $F-\Delta F$ (Step 245). Repeat the procedure and in the same time reduce the step size $\delta F$ proportionally to the ratio of $|P(F+\Delta F)-P(F-\Delta F)|/|P(F+\Delta F)-P(F-\Delta F)|$ until the two FFTs are similar, that is, $P(F+\Delta F)=P(F-\Delta F)$. The F is then finally chosen as the best focus position (Step 250).

Techniques for FFT data processing are discussed, for example, in National Univ. of Singapore, Scanning, Vol. 19,553 (1997), and in National Institute of Standards and Technology, SPIE Vol. 2725, p. 504 (1996).

Disadvantages of FFT processing include:

Too slow

Very much image feature shape and feature density dependent

Very vulnerable to FIIR

Very vulnerable to magnification change during focus

The search time and accuracy heavily depends on the shape of the curve of P value versus focus. If with a nearly flat top, the search will either be extremely slow or stop at an inaccurate position. If with a sharp top and the curve is not symmetric about the peak, the search will end at a position far from the ideal.

Power spectrum analysis methods determine resolution of a SEM from the width of the power spectrum, and detect astigmatism from the asymmetry of the power spectrum. Disadvantages include:

Too slow

Sensitive to noise

Maximum-gradient method measures gradient sum over image lines, and maximizes the sum while adjusting focus. FIG. 3 shows a prior art maximum-gradient method used to process the data as at step 120. A region of interest (ROI) is chosen with random features or good edges (step 305). Gradient is calculated either by each pixel or along certain directions (step 310). Total gradient is taken as a measurement of focus sharpness (step 315). Astigmatism correction is achieved using a similar method.

Gradient sum data processing techniques are discussed, for example, in W. J. Tee et al., J. PHYS. E: SCI. INSTRUM. 12, 35 (1979).

Disadvantages of maximum-gradient methods include:

Very sensitive to noise

Sensitive to sample rotation while focusing

The variance of differences method finds the difference of two scan lines in two images each acquired at a different focus or stigmator setting, and looks for the highest variance of the difference. This method is better than the gradient methods in that it is insensitive to tilted-plan background noise. However, it also suffers from all other kinds of noise and image rotation, the FIIR.

All the above techniques have more difficulties and failures if working under coarse adjustment of focus and astigmatism correction. The reason is that these techniques do not take into account the factors of image rotation and magnification change during focus. Besides, all these methods are not coupled with auto-contrast. Without proper contrast during runt time, auto-focus and auto-astigmatism-correction will not run properly. In many situations, the system needs to run coarse adjustment, even during real time test. In general, the existing techniques lack high reliability, accuracy and repeatability at high speed.

SUMMARY OF THE INVENTION

Embodiments in accordance with the invention provide respectively for auto-focus, auto-contrast, and auto-correction of astigmatism in both x and y directions independent of sample feature orientation and image deformation, insensitive to various kinds of noise, and insensitive to image magnification change caused by focus. Poor image contrast is handled by the auto-contrast capability. Thus, embodiments in accordance with the invention can achieve high reliability and repeatability at relatively high speed.

Embodiments in accordance with the invention provide methods for setting parameters of a focused-particle-beam column (e.g., of a SEM or FIB system) to acquire a focused image of a sample, comprising: aligning the column; acquiring an image of the sample having a focus-rotation center in the image; setting image contrast; and setting column focus. Acquiring an image of the sample can comprise acquiring an over-focused image of the sample; acquiring an under-focused image of the sample; and calculating a focus-rotation center from an image feature common to the over-focused image and the under-focused image. Acquiring the over-focused image and acquiring the under-focused image can comprise setting the column off-focus by a predetermined amount. Setting column focus can comprise selecting a region of interest of the image around the focus-rotation center and filtering the region of interest with an edge-enhancement filter. Filtering the region of interest with an edge-enhancement filter can comprise applying a Sobel filter to pixels of the region of interest. Setting column focus can further comprise calculating a value representing image sharpness within the region of interest. Calculating a value representing image sharpness can comprise applying a semi-Kurtosis matrix to pixels within the region of interest. Setting column focus can comprise performing a Golden Section search over the region of interest to determine an optimum focus setting for the column.

Embodiments of methods in accordance with the invention can comprise correcting astigmatism of the column. Correcting astigmatism of the column can comprise selecting a region of interest of the image around the focus-rotation center and filtering the region of interest with an edge-enhancement filter. The edge-enhancement filter can comprise a Sobel filter applied to pixels of the region of interest. Correcting astigmatism of the column can further comprise calculating a value representing degree of astigmatism.

Calculating a value representing degree of astigmatism can comprise applying a semi-Kurtosis matrix to pixels within the region of interest. Correcting astigmatism of the column can comprise performing a Golden Section search over the region of interest to determine an optimum astigmatism-correction setting for the column.

Setting image contrast can comprise operating the column to acquire a low-contrast image; operating the column to acquire a high-contrast image; and counting saturation levels of pixels in the images. Setting image contrast can further comprise averaging the counting of saturation levels of pixels in the images. Setting image contrast can comprise applying a bisection method to set the image contrast at a level meeting pre-set criteria.

Embodiments in accordance with the invention further provide imaging systems having a focused-particle-beam column and control apparatus for setting parameters of the column to acquire a focused image of a sample as described herein.

These and other features consistent with the invention will become apparent to those of skill in the art from the illustrations and description which follow.

DETAILED DESCRIPTION

Figure 1:
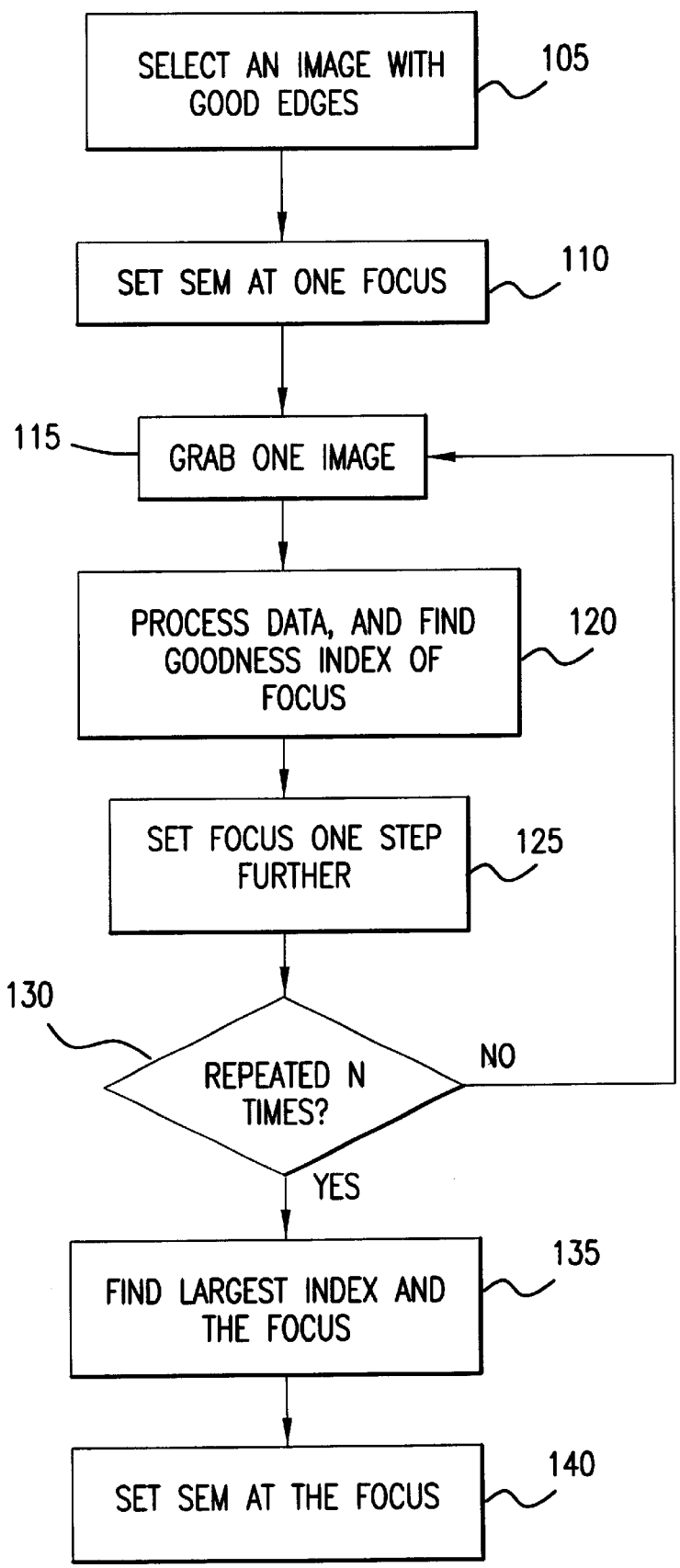
FIG. 1 shows one general procedure of prior-art auto-focus methods.
Figure 2:
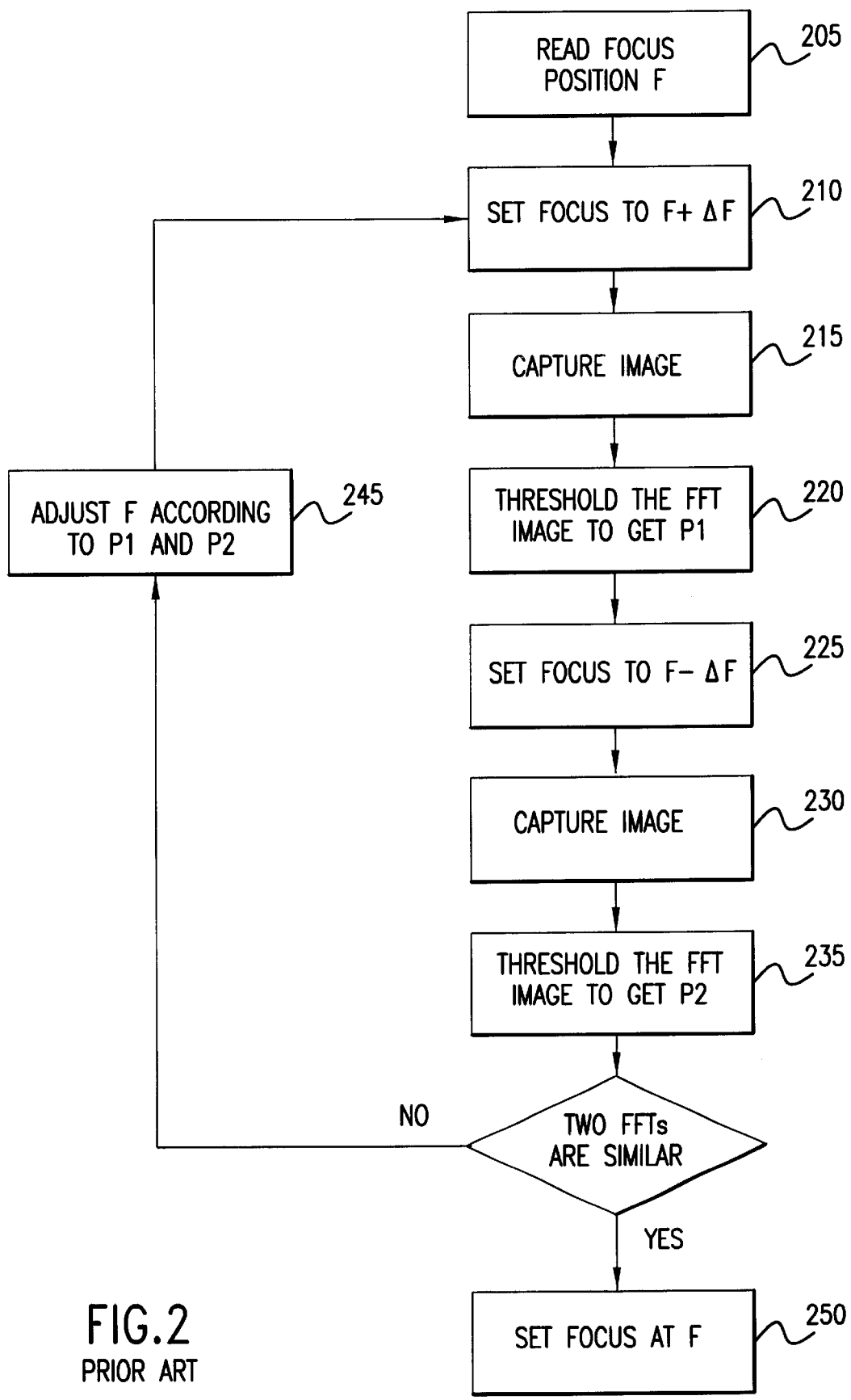
FIG. 2 shows a prior art fast-Fourier transform (FFT) method of auto-focus.
Figure 3:
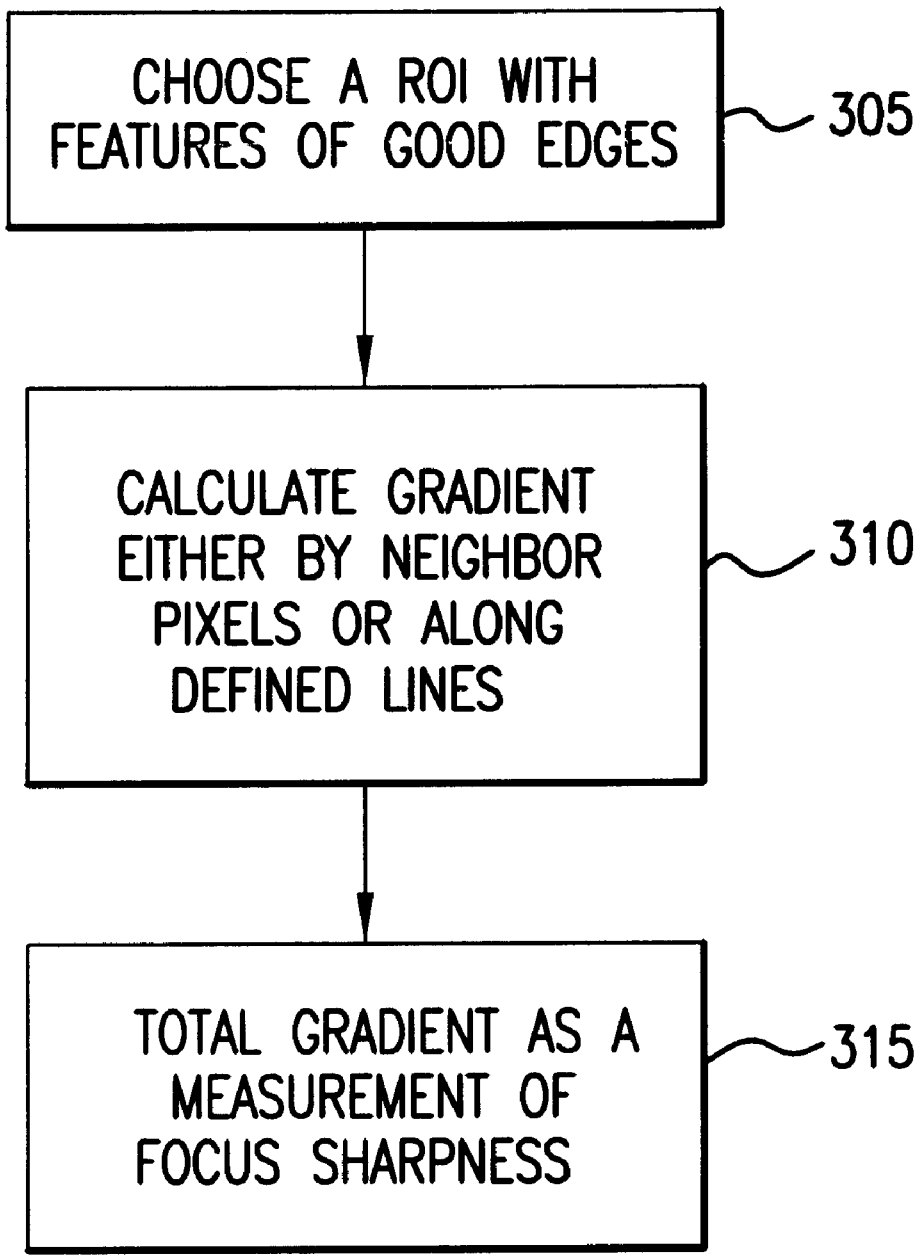
FIG. 3 shows a prior art maximum-gradient method for the data processing part as at step 120.

Embodiments in accordance with the invention will now be described with reference to the drawing figures.

All automation systems need to be set properly before running automatic batch jobs. Settings required to run beam automation are not extreme, but fairly common:

Charged-particle-beam (e.g., SEM) column is working properly

The primary beam of the charged-particle-beam system (e.g., SEM) is well aligned and the FIIR center is within the image and not close to the edges of the image There are at least some features in image Detailed functional steps for auto-focus will now be described with reference to FIGS. 4–6. Auto-astigmatism correction in the x-direction or y-direction is performed using the same mechanism as for auto-focus except that the stigmator setting in x or y is adjusted instead of the focus.

In our work, the image sharpness is used to measure the degree of defocus and astigmatism. (Prior-art techniques do not use the same measurement for both.) This is an advantage in simplifying and having the integrity of the processes. The ideal of image sharpness is similar to the ideal of focus goodness in auto-focus. In the prior art, the astigmatism is measured in different ways, for example, by the spot shape in the FFT image after thresholding. Some previous work uses the term image sharpness as well, but the definition and calculation of the image sharpness is different.

Before auto-focus, image contrast or saturation level is automatically checked. Once the level is beyond a certain criteria, image contrast is automatically triggered. (A method for performing this "auto-contrast" adjustment is described below with reference to FIGS. 12A–12F.) Focus range could vary a lot at different system magnification settings. The focus range in the work is determined as a function of magnification, and automatically adjusted during run time. An image is "grabbed" (e.g., acquired using the SEM or FIB, or retrieved from memory if previously acquired). Image sharpness is calculated as in the following three steps: (1) A ROI image is taken from the grabbed image, a round area with a radius of 150 pixels or a 300×300 pixels box, around the image rotation center. (The image rotation center may be previously determined using the method described below with reference to FIGS. 8–10.) (2) The ROI image is edge-enhanced using the Sobel edge enhancement method. The key of this enhancement is that it enhances the edges isotropically at every orientation. (3) The enhanced result is then calculated using a semi-Kurtosis method for all pixels in the ROI image. The final result represents the image sharpness. A number of selective positions of focus (stigmator setting if in the case of auto-astigmatism-correction) are chosen for the above process. The positions are chosen with the optimization method of Golden-Section-Search, described below with reference to FIGS. 11A–11F. The good focus position is searched in a loop until the pre-set resolution is met. The system is set at the focus. Frame averaging is usually not necessary, and is thus another good point for saving processing time.

Figure 4:
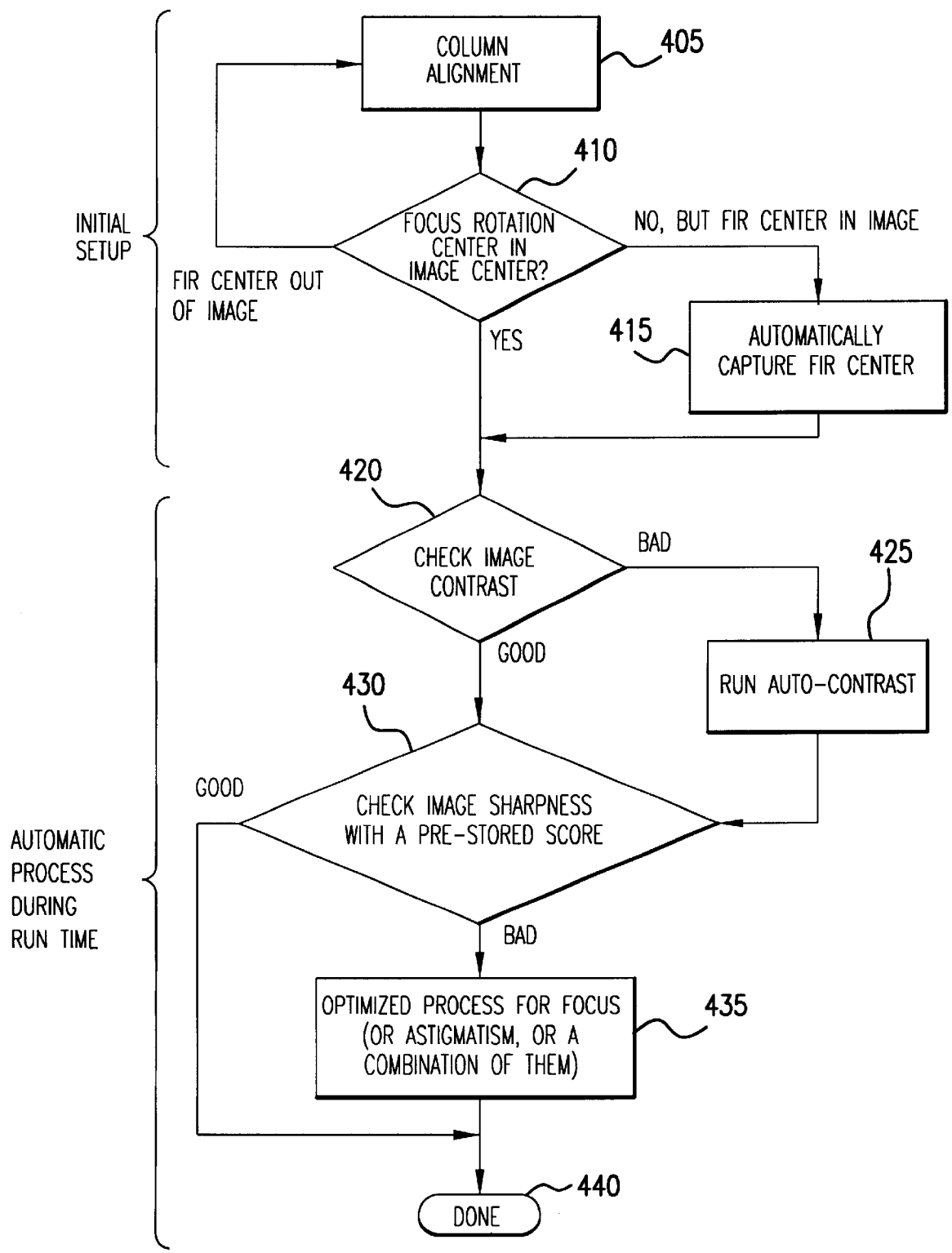
FIG. 4 shows an automation process in accordance with the invention, and how to pr-set the system.

FIG. 4 shows principal steps of an automation process which can be used for auto-focus as well as for astigmatism correction. After initial setup, the column is aligned (steps 405 to 415). The center of rotation of the image is determined (step 415) and, if the center of RIIR is not in the image, the column is re-aligned. If the center of FIIR is in the image and not far from the image center, the center is captured and the position is stored for the use of automatic batch run. During batch job run, the beam automation process is done either at each new position of the sample or at selective positions depending on applications. The beam automation process is performed at every such position repetitively. In the process, the image contrast is checked first to see whether the image saturation is severe. If the contrast is bad, the auto-contrast routine is performed (step 425). If good, the image sharpness is checked and compared with a pre-stored sharpness score (step 430). If the sharpness is bad, the auto-focus process is started (step 435), otherwise it is skipped. The auto-focus is done at step 440 for the current sample position. The auto-focus could be triggered without the sharpness check. The check is designed to save time. Same as the auto-contrast, it could be performed without the saturation check and be started directly. The same mechanism applies to auto-astigmatism-correction.

Step 435 could be replaced by a number of iterative loops of auto-focus and auto-astigmatism-correction, and at the end of each loop the store is checked to see whether the image sharpness is sufficiently high. This replacement procedure works under severe astigmatism as well.

Figure 5:
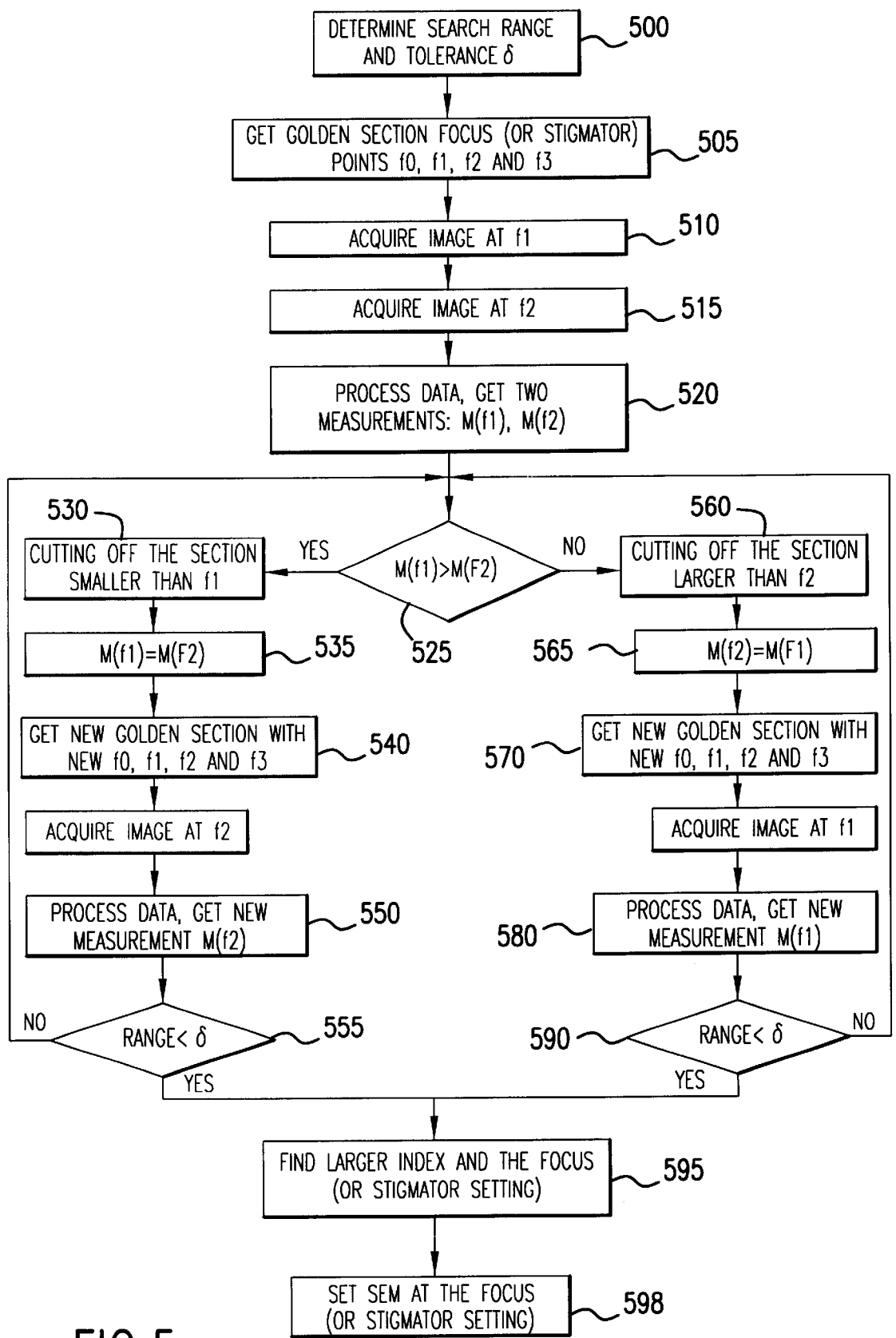
FIG. 5 shows an optimized focus automation process in accordance with the invention.

FIG. 5 shows principal steps of a focus automation process in accordance with the invention. The search range [f0, f3] is calculated according to the system's magnification, and the tolerance δ is defined (Step 500) according to the resolution requirement. Golden focus section points for focus f1 and focus f2 are obtained (step 505) using the Golden Section search method described below with reference to FIGS. 12A–12F. An image is acquired at a first focus f1 (step 510) and another image is acquired at focus f2 (step 515), where f0<f1<f2<f3. The image data is processed (step 520) to obtain two sharpness measurements: M(f1) and M(f2). The two measurements M(f1) and M(f2) are compared (step 525).

If M(f1) is greater than M(f2) at step 525, the section smaller than f1 is cut off (step 530). The new search range is [f1, f3]. Replace M(f1) by M(f2) (step 535). The new search points (f0, f1, f2, f3) in the new search range are defined (step 540). An image is acquired at the new focus value f2 (step 545). The image data is processed to obtain a new sharpness measurement M(f2) (step 550). If the new smaller range is not less than the resolution factor δ (step 555), the process repeats from step 525. If the range is less than the resolution factor δ, the larger index and focus are selected (step 595) and the charged-particle-beam system (e.g., SEM or FIB) is set at this focus (step 598).

Oppositely, if M(f1) is not greater than M(f2) at step 525, the section larger than f2 is cut off (step 560), so that the remaining M(f2) is equal to M(f1) (step 565). Golden Sections are acquired with the new values of f1 and f2 (step 570). An image is acquired at the new focus value f1 (step 575). The image data is processed to obtain a new measurement M(f1) (step 580). If the range is not less than the resolution factor δ (step 590), the process repeats from step 525. If the range is less than δ, the larger index and focus are selected (step 595) and the charged-particle-beam system (e.g., SEM or FIB) is set at this focus (step 598).

The process of FIG. 5 is also used for astigmatism correction in the x-direction or the y-direction by substituting adjustment of the system stigmator for adjustment of focus.

Figure 6:
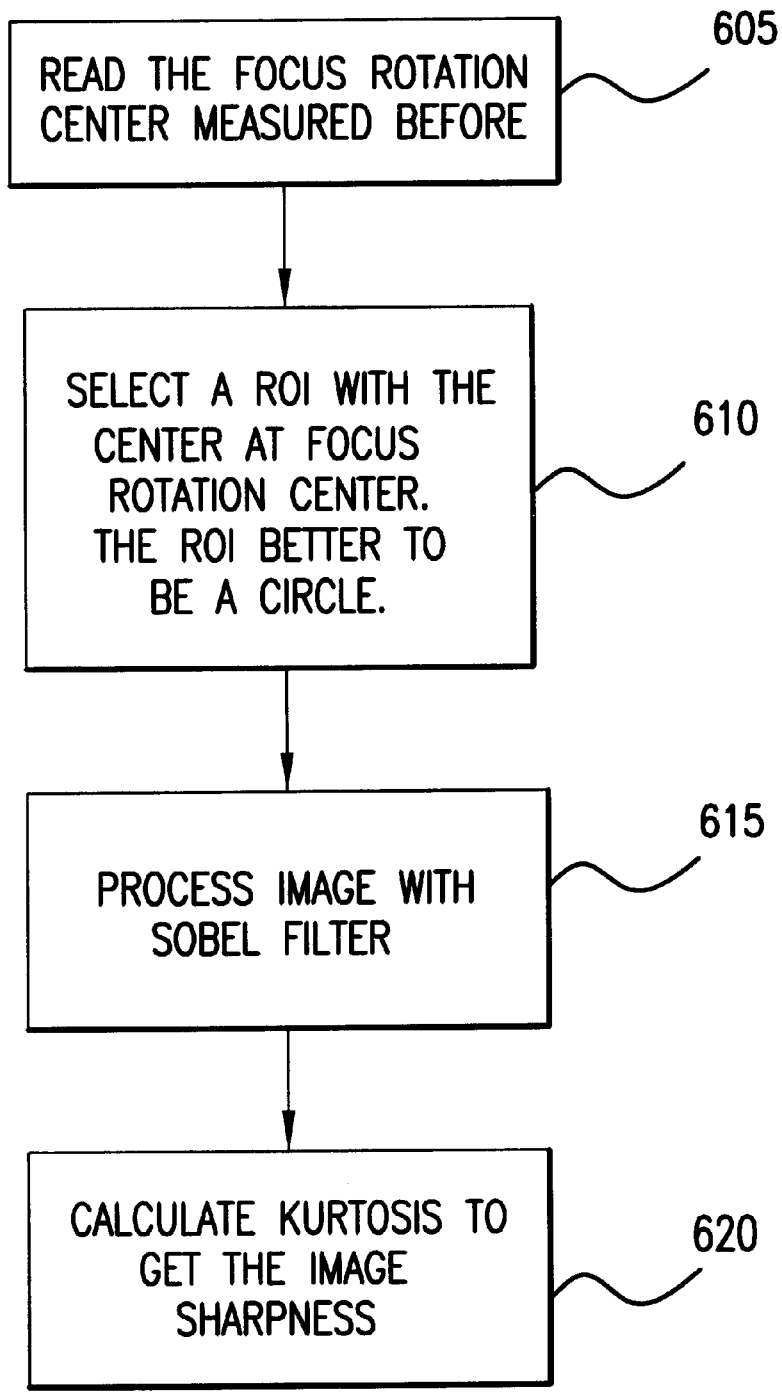
FIG. 6 shows a data processing method in accordance with the invention.

FIG. 6 shows principal steps of data processing methods in accordance with the invention. The FIIR center previously measured is read (step 605). A ROI image is selected having its center at the focus-rotation center (step 610), the ROI image preferably being a circular image area. The selected ROI image is processed with a Sobel edge enhancement filter (step 615). The final sharpness measurement is calculated using a semi-Kurtosis method for all pixels in the ROI image (Step 620).

Because focus, correction of x-direction astigmatism and correction of y-direction astigmatism are functionally independent, the search for the ideal points can be achieved by running auto-focus, auto-x-stigmatism, and auto-y-stigmatism, respectively. However, since the auto-focus and auto-astigmatism corrections are all based on image processing, a good image cannot always be set by adjusting focus or stigmator settings only. For example, good focus cannot be set if astigmatism is severe, and vice versa. Therefore, in case of severe coexistence of out-of-focus and astigmatism, multiple loops of auto-focus and auto-stigmatism need to be done.

Figure 7:
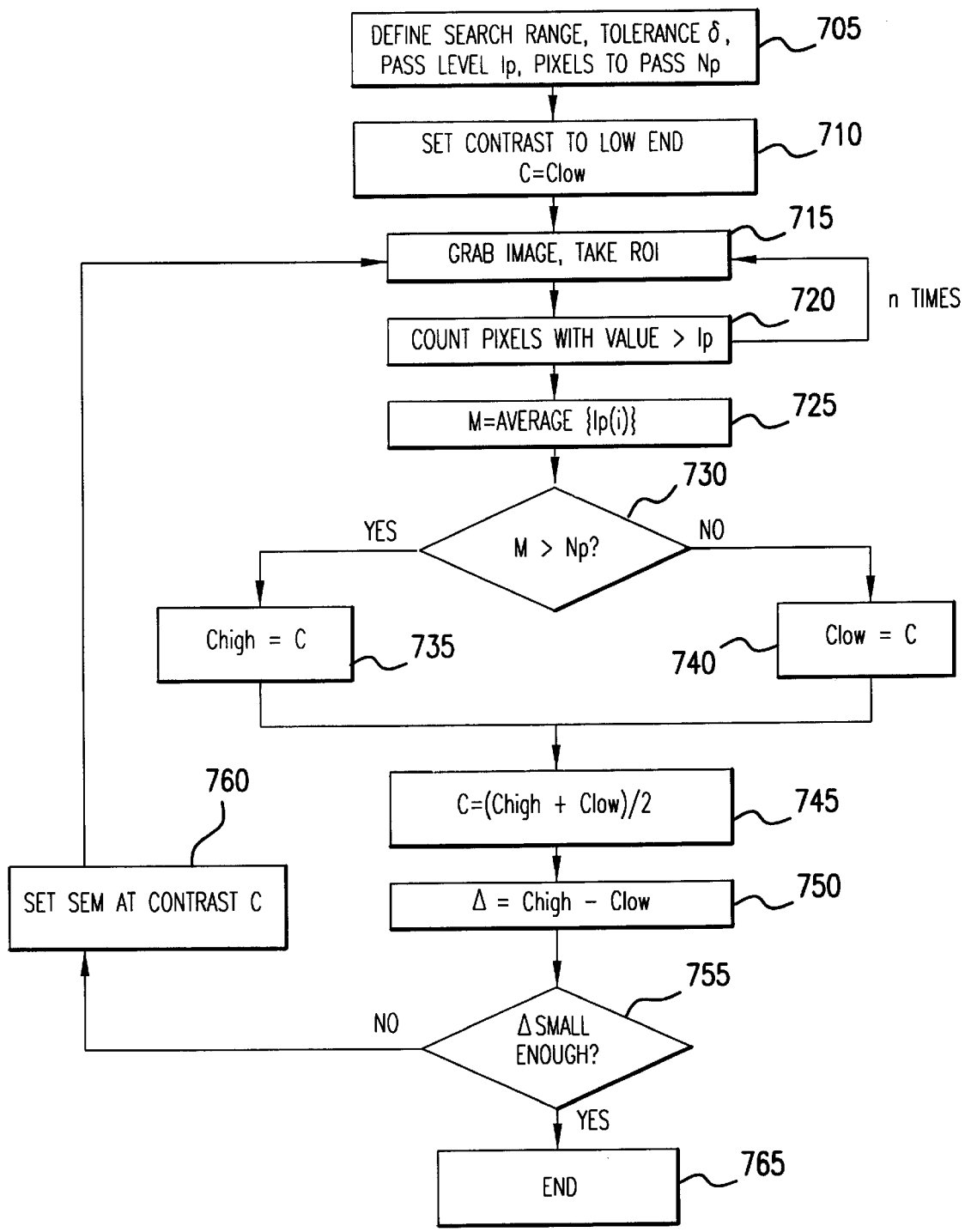
FIG. 7 shows an auto-contrast method in accordance with the invention.

Good image contrast is important to successfully performing auto-focus and auto-stigmatism. It is important to obtain more image information and avoid large digitization errors and therefore increase the reliability and repeatability. In summary, an auto-contrast method in accordance with the invention includes the following steps:

set contrast to far ends grab ROI images (regardless of the rotation center)

count the saturation levels average the counting to reduce noise effect reset contrast using Bisection method to search the desired contrast until a pre-set criteria is reached More detailed functional steps for auto-contrast in accordance with the invention are:

set high and low end contrast so that the desired contrast is in between set the system at one contrast grab a ROI image around the center of the image, not specific count how many pixel values are above the pre-defined critical gray value T1 grab another ROI image count how many pixel values are above the same critical gray value T1 repeat a few more times the above steps in case of severe noise (normally one time is enough)

average the number of pixels if more than one time check if the result is above the critical pixel number T2 if the result is above T1, it is stored as the new high end contrast if the result is below T1, it is stored as the new low end contrast, either the previous or this step will cut the search range by half the average of the low and high is used to set the system's contrast repeat the above until the difference of low and high end contrast is smaller than a third criteria T3, the contrast resolution factor FIG. 7 shows an auto-contrast method in accordance with the invention. The search path is also optimized using Newton's Bisection method (described below with reference to FIGS. 12A–12F). Values for the search range, tolerance δ, intensity "pass" level Ip, and "pixels to pass" Np are defined (step 705). The system contrast setting is set at Clow (step 710). An image is acquired and a ROI image is selected from the grabbed image (step 715). Pixels having an intensity value greater than level Ip are counted (step 720). Steps 715 and 720 are repeated in case of severe noise, for example n times. The pixels are then averaged, M=Average {Ip(i)} (step 725). The result M is compared with Np (step 730). If M is greater than the defined "pass" value Np, it is stored as the new high-end contrast, Chigh (step 735). If the pixel-intensity average M is smaller than the defined "pass" value Np, it is stored as the new low-end contrast, Clow (step 740).

The new system contrast is set equal to the average of the high-end contrast value and the low-end contrast value, (Chigh+Clow)/2, at step 745. In doing this, the new search range is decreased to half of the previous one. The difference, Δ, between the high-end contrast value Chigh and the low-end contrast value Clow is determined (step 750) and checked against a defined resolution threshold (step 755). If the contrast-value difference Δ is not small enough, the charged-particle-beam-system contrast level is reset (step 760) and the process repeats from step 715. When the contrast-value difference Δ is within the tolerance, the process ends (step 765).

Coarse auto-focus and coarse auto-astigmatism correction, and coarse auto-contrast are achieved in the same manner respectively as for the fine adjustments simply by setting the range factor larger. Increasing the search range by a factor of 2 increases the search time only by ~10%, mostly importantly—without the lost of resolution and reliability.

Typically, the total number of frames for each of the above processes is about 11. The time for each process is less than 12 seconds for our system configuration, using a Pentium II computer and Windows NT operating-system platform. The achieved focus accuracy is high enough and comparable to what an expert can achieve manually.

Figure 8:
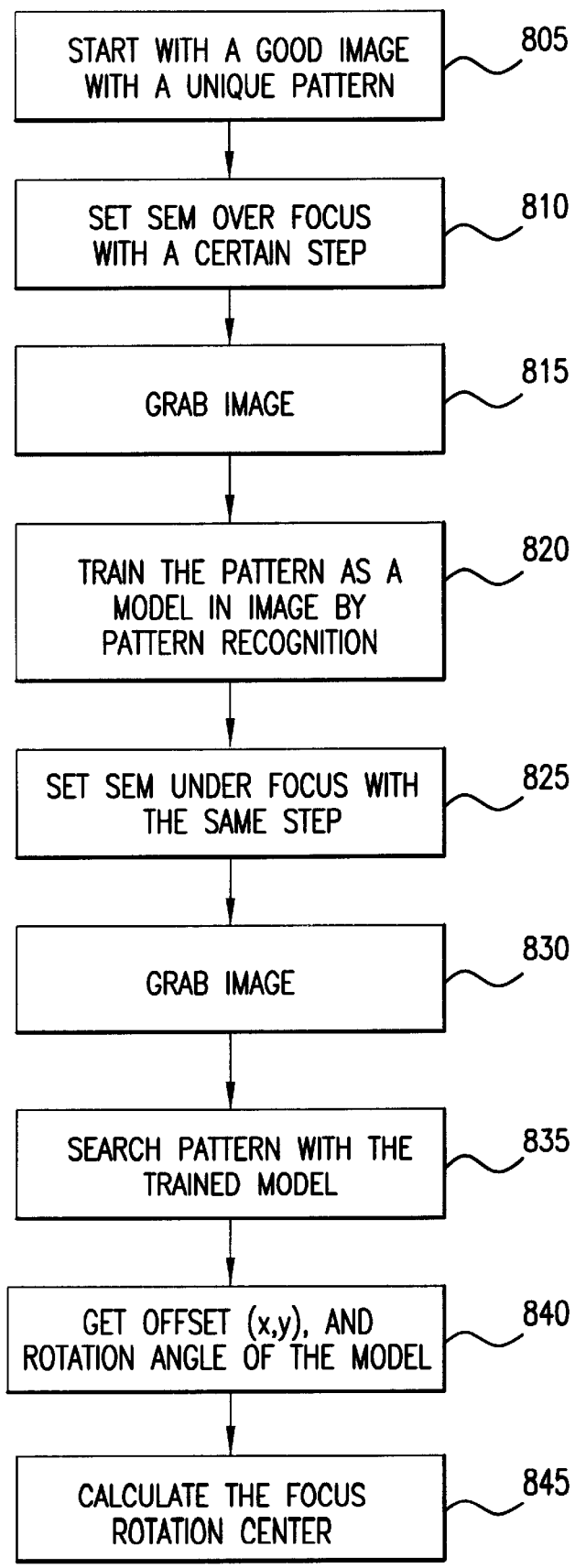
FIG. 8 shows a method of capturing the rotation center of an image in accordance with the invention.

FIG. 8 illustrates a method of capturing the rotation center of an image in accordance with the invention. It is important that the ROI images have their center on or near the focus-image-rotation center, and the FIIR center should also stay still while focus changes. Notice that the FIIR center is not the image rotation center when scanning direction is adjusted. Image rotation during focus is not considered in prior-art auto-focus methods, and ironically is a nature of the focus, but ignored. It is perhaps partially because the prior-art works are dealing with the fine adjustment only. Even for the fine adjustment, ignoring FIIR will cause problems in accuracy and reliability. The system is designed to capture the rotation center in accordance with the invention. To do this, two images are acquired at two focus settings, one on each side of good focus, with the same off-focus level, as described below with reference to FIG. 10. A ROI of any unique feature is selected. Pattern recognition is used to find the offset and rotation angle with the $2^{nd}$ image. The FIIR center is calculated based on the offset and the angle, as described below with reference to FIG. 9.

The method of FIG. 8 begins with selection of a well-focused image that contains at least one unique feature (step 805). Let the focus be represented by F. The charged-particle-beam-system focus is set to over-focus at F−ΔF (step 810). An image is acquired (step 815). A model is trained using the unique feature in the image by pattern recognition (step 820). The charged-particle-beam-system focus is then set to under-focus at F+ΔF (step 825). An image is acquired (step 830). The pattern is searched in this image using the trained model obtained in step 820 (step 835). The (x,y) offset and rotation angle θ between the images acquired in steps 815 and 830 are found through pattern recognition (step 840). The focus-rotation center is then calculated mathematically (step 845).

Figure 9:
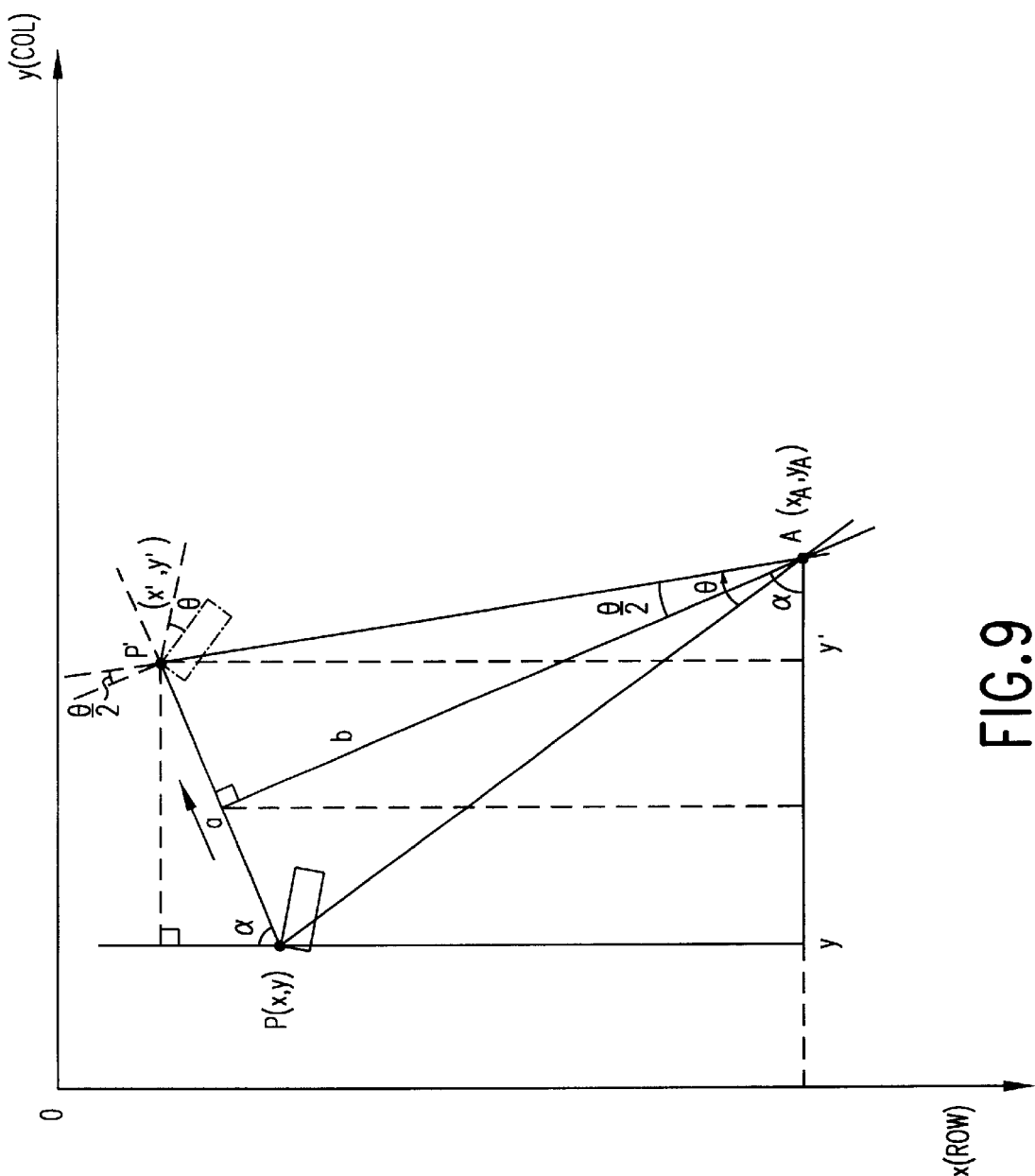
FIG. 9 illustrates a method of calculating focus rotation center in accordance with the invention.
Figure 10:
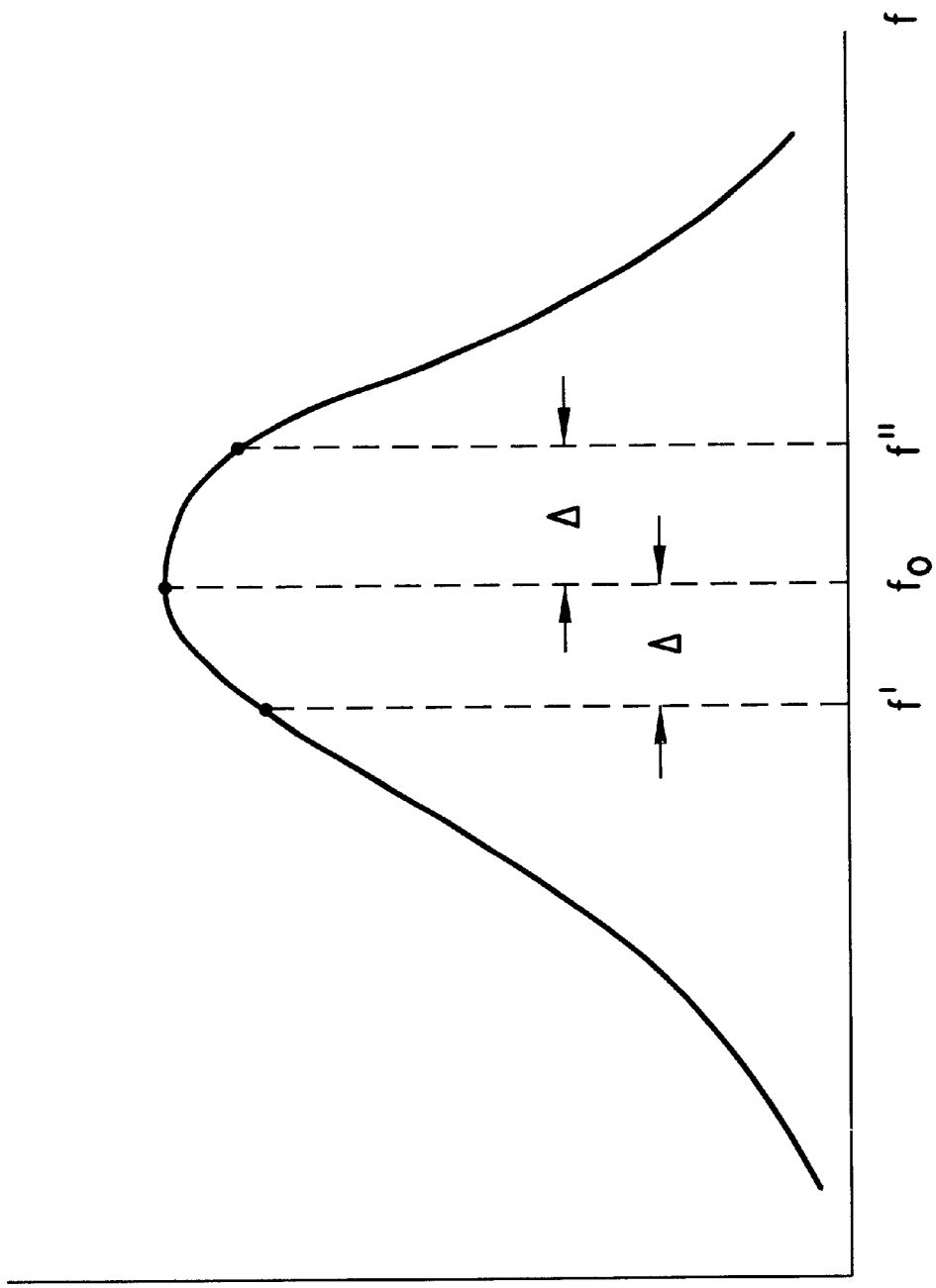
FIG. 10 illustrates adjustment of focus as part of determining focus-rotation center in accordance with the invention.
Figure 11A:
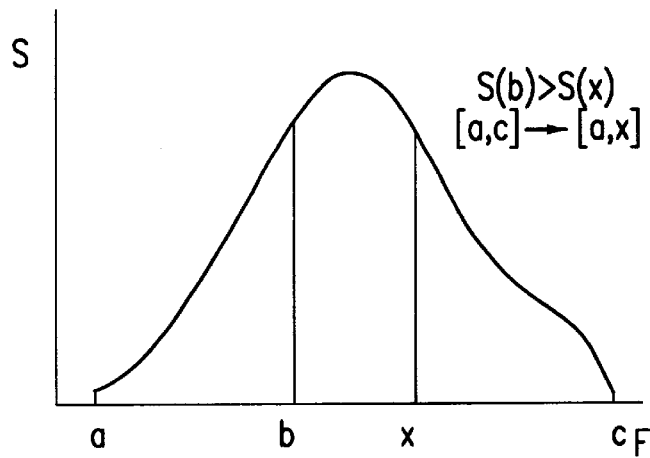
FIGS. 11A–11F illustrate the sequence of a Golden Section search employed in embodiments of the invention.
Figure 11B:
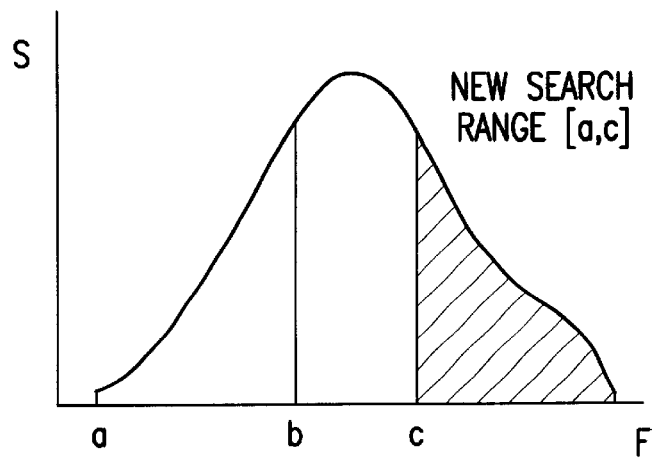
Figure 11C:
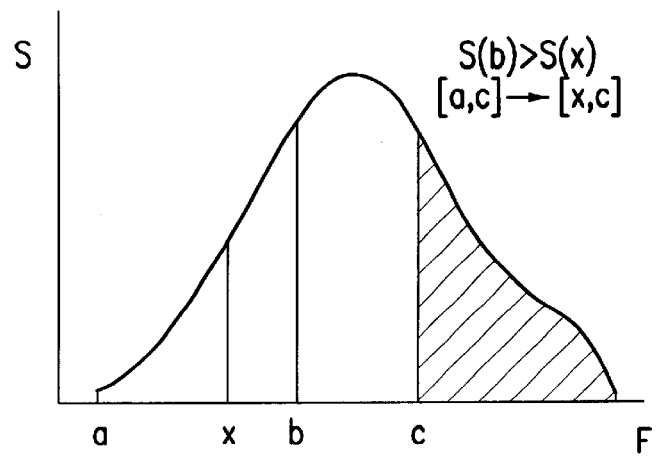
Figure 11D:
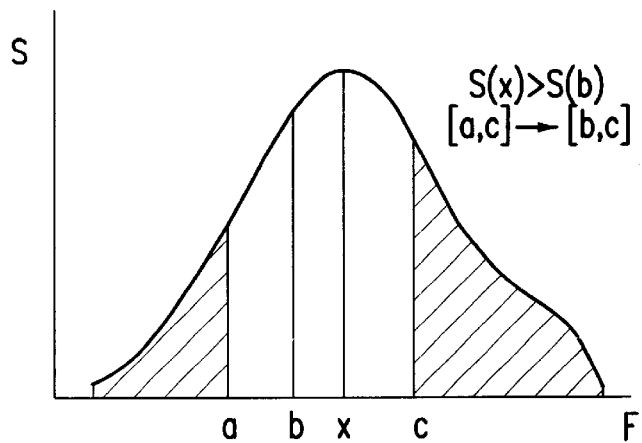
Figure 11E:
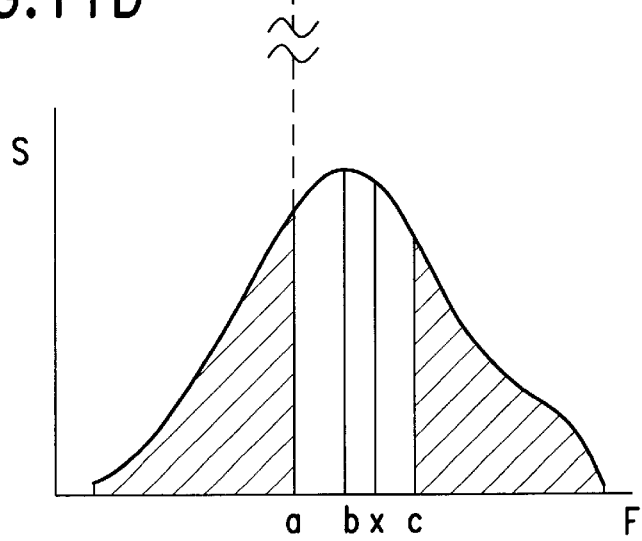
Figure 11F:
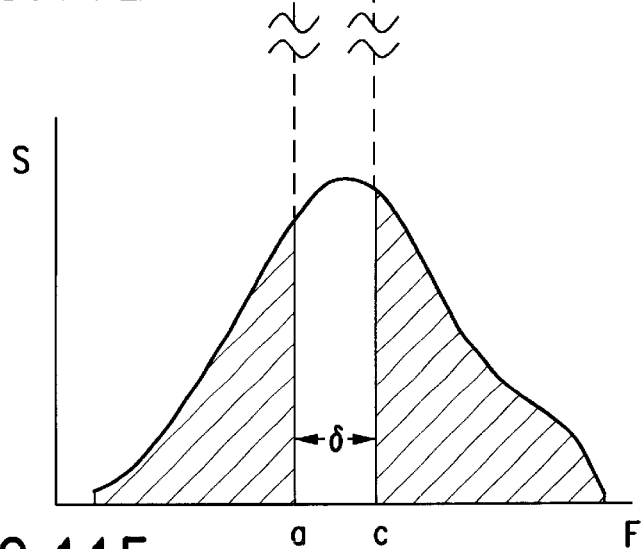

FIGS. 9 and 10 illustrate a method of calculating focus rotation center in accordance with the invention. Referring to FIG. 9, every feature on the image, in the plane of the semiconductor wafer, rotates the same angle θ. The rotation center point is at $A(X_A,Y_A)$. Due to the focus-induced image rotation, a corner point of a feature in the image moves from position P(x,y) to position P'(x',y'). To acquire the focus-rotation center point $A(X_A,Y_A)$:

Adjust the focus setting to a level F at which the image is focused. The image is considered focused when the image sharpness is maximized.

Set focus to a level at which the image is over focus, F−ΔF, acquire the image, and search the trained feature.

Set focus to a level at which the image is under focused, F+ΔF, acquire an image with a unique feature, and train the feature for image recognition.

The search provides the coordinates of P(x,y) and P'(x',y'), and the rotation angle θ.

Calculate the position of focus-rotation center $A(X_A, Y_A)$ as follows:

Draw a line linking points P(x,y) and P'(x',y'). The distance $\overline{PP'}$ is $$a = \sqrt{(x'-x)^2 + (y'-y)^2} \quad \text{Equation [1]}$$

At the mid-point between points P and P', draw a line b perpendicular to $\overline{PP'}$.

The focus-rotation center must be on this line b.

Draw a line through point P' and parallel to line b.

Draw another line through point P' with an angle of θ/2 as shown. This lines crosses line b at the center of rotation A. A is the center of rotation.

Clearly, $$b = \frac{a}{2} \text{ctan}\left(\frac{\theta}{2}\right) \quad \text{Equation [2]}$$

$$Y_A = y + \frac{y'-y}{2} + b\cos\alpha \quad \text{Equation [3]}$$

Since $\alpha = \tan^{-1}\frac{y'-y}{x'-x'}$ Equation [4]

using Equations [1]–[4], $$Y_A = \frac{y+y'}{2} + \frac{\sqrt{(x'-x)^2 + (y'-y)^2}}{2} \cdot \text{ctan}\left(\frac{\theta}{2}\right) \cdot \cos\left(\tan^{-1}\left(\frac{y'-y}{x'-x}\right)\right)$$

Similarly, $$X_A = x' + \frac{x-x'}{2} + b\sin\alpha$$

$$X_A = \frac{x+x'}{2} + \frac{\sqrt{(x'-x)^2 + (y'-y)^2}}{2} \cdot \text{ctan}\left(\frac{\theta}{2}\right) \cdot \sin\left(\tan^{-1}\left(\frac{y'-y}{x'-x}\right)\right)$$

Figure 12A:
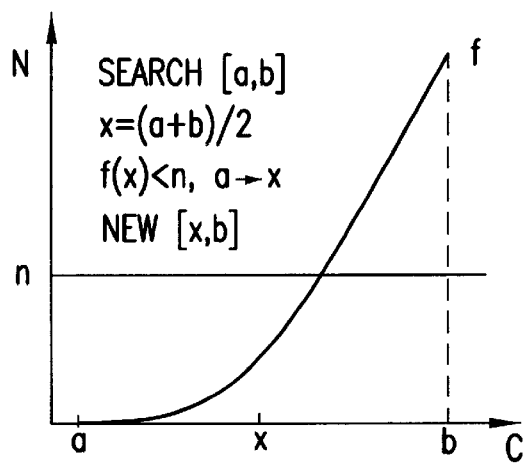
FIGS. 12A–12F illustrate the sequence of an auto-contrast bisection method employed in embodiments of the invention.
Figure 12B:
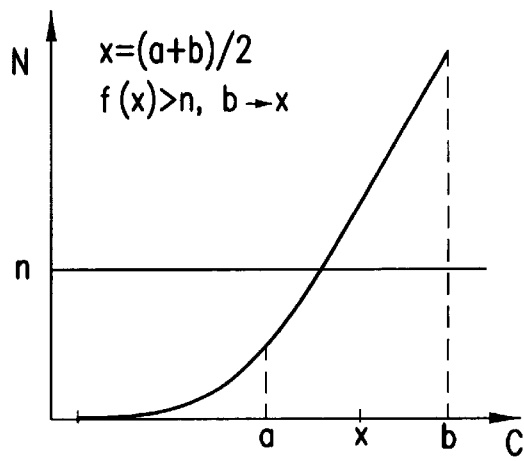
Figure 12C:
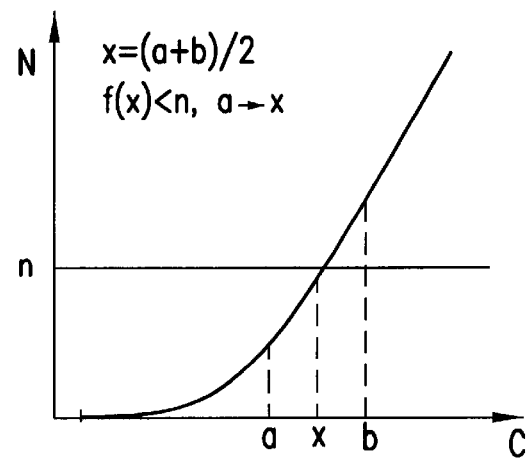
Figure 12D:
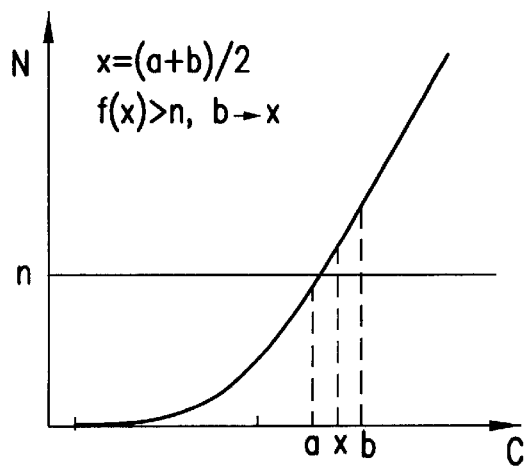
Figure 12E:
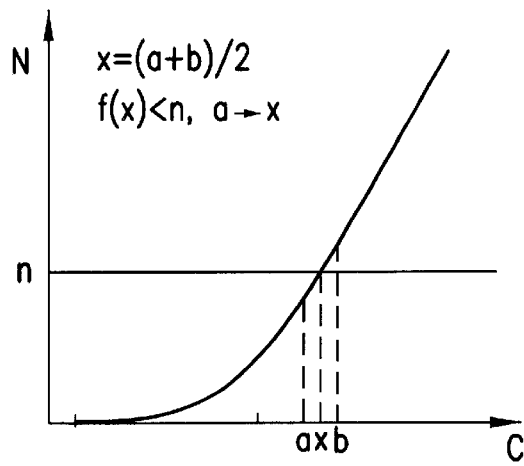
Figure 12F:
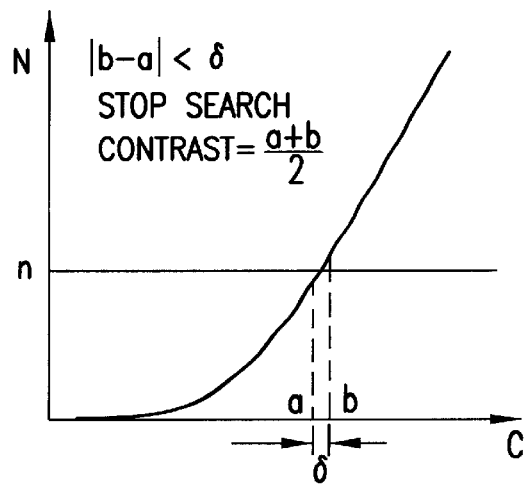

FIGS. 12A–12F illustrate the sequence of Newton's bisection method used in auto-contrast methods in accordance with the invention. As shown in FIG. 12A, the region [a,b] is searched, bisected, and truncated. At the midpoint x=(a+b)/2 of the search region in FIG. 12A, f(x)<n, so the region from a to x is truncated and the region from x to b of FIG. 12A is searched in the next iteration shown in FIG. 12B as the region from a to b. At the midpoint x=(a+b)/2 in FIG. 12B, f(x)>n. The process is repeated as shown in FIGS. 12C–12F until the desired limit $$|b-a|<\delta$$

is achieved.

The Golden Section Search method is known, for example, from W. PRESS et al., *Golden Section Search in One Dimension*, Numerical Recipes in C, Cambridge University Press (1992), §10.1, pp. 397–401. FIGS. 11A–11F illustrate the sequence of a Golden Section search in which a section of F is chosen as the search range. S as a function of F is searched for a peak value until a desired limit is reached.

The Sobel edge enhancement filter used in embodiments of the invention is also known in the art. Matrices "A" and "B" are applied to the pixels of an image, to the eight closest neighbors of each pixel as well as the pixel itself A and B are operators. When they are applied to the pixels, A is equivalent to partial gradient along x direction, and B along y. DV/dr is the total gradient. The resulting enhancement is $$\text{Matrix } A = \begin{bmatrix} -2 & 0 & 2 \\ -1 & 0 & 1 \\ -2 & 0 & 2 \end{bmatrix} \Rightarrow \frac{\delta}{\delta x}$$

$$\text{Matrix } B = \begin{bmatrix} -2 & -1 & -2 \\ 0 & 0 & 0 \\ 2 & 1 & 2 \end{bmatrix} \Rightarrow \frac{\delta}{\delta y}$$

Let's denote the neighbor pixel values as:

$V_{11} \quad V_{12} \quad V_{13}$ $V_{21} \quad V_{22} \quad V_{23}$ $V_{31} \quad V_{32} \quad V_{33}$ Thus, $AV = -2 V_{11} + 2 V_{13} - V_{21} + V_{23} - 2 V_{31} + V_{33}$ $BV = -2 V_{11} - V_{12} - 2 V_{13} + 2 V_{31} + V_{32} + 2 V_{32}$ After this operation, the value of dv/dr is taken to replace $V_{22}$ in the next image. The same operation goes for each pixel in the ROI including the pixels on the edge/edges.

The resulting enhancement is $$\frac{dv}{dr} = \sqrt{\left(\frac{\delta v}{\delta x}\right)^2 + \left(\frac{\delta v}{\delta y}\right)^2}$$

$$\frac{dv}{dr} = \sqrt{(AV)^2 + (BV)^2}$$

Thus for a circular ROI, the resulting image has a radius one pixel smaller. For a box ROI, the resultant ROI in the image is two rows and two columns smaller in size than the ROI prior to application of the Sobel filter.

The full Kurtosis method is $$K = \frac{1}{N}\sum_i^N \left(\frac{V_i - \overline{V}}{\sigma}\right)^4 - 3$$

A semi-Kurtosis method can be used in embodiments of the present invention because the values are consistent and are being compared against one another rather than performing an absolute calculation:

$$K' = \sum_i^N (V_i - \overline{V})^4$$

The semi-Kurtosis method is statistical, so noise is averaged out at the same time as focusing is performed. This renders the operation insensitive to noise.

Improvements of performance accurate repeatable far more robust than other gradient methods a lot faster than FFT method, and more robust independent of sample feature geometry independent of focus-induced image rotation independent of image deformation including changes in aspect ratio, and orthogonality very insensitive to various kinds of noise auto-contrast considered, which is crucial, and another factor not considered in other auto beam methods all search paths are optimized in various ways In many other methods, the curve of focus versus image sharpness measurement has two peaks in charged-particle-beam-system conditions with astigmatisms. However, with our definition of image sharpness, the measurement is not as sensitive to either one of the x and y directional astigmatism. The measurement curve therefore has only one peak in normal operation conditions that do not have huge astigmatism run time drift in x and/or y directions. Only with extremely bad astigmatisms, the image sharpness curve will show two peaks. If this happens, running auto-astigmatism-correct could bring the image sharpness curve back to one peak. The foregoing will focus on beam automation under normal operation conditions.

Embodiments in accordance with the invention provide ROI method in every aspect of the listed automation methods. The purpose is to speed the process with a smaller block of data without loss of sufficient representative information. Specifically for auto-focus, the ROI selection is essential to avoid the FIIR effect. For auto-astigmatism-correction and auto-contrast, there is no need to place the ROI around the FIIR center. The size of ROI has been experimentally chosen and can vary within some range.

Embodiments in accordance with the invention provide:

1. Method for processing data to obtain a measurement of focus, combining edge enhancement and Kurtosis (or variance) calculation
2. Method for processing data to get the measurement of astigmatism, same method as above
3. Optimization of the search paths
4. Method for Auto contrast
5. Method to measure focus rotation center Basic functional steps for an auto-focus method in accordance with the invention are shown in FIGS. 4, 5 and 6.

test the system status is tested to assure it is in good condition to proceed with beam automation measure the image rotation center by imaging recognition grab an image and get data in the region of interest around image rotation center process the region of interest images with Sobel Edge enhancement filter statistically calculate the processed result with semi-Kurtosis to get image sharpness score search the focus position with the optimization method of Golden-Section-Search (FIG. 5)

judge the level of image sharpness set the system at the focus found if proper

While the detailed description above has been given with respect to a SEM system, methods and principles of the invention are applicable to charged-particle-beam systems of other types, such as focused-ion-beam (FIB) systems. Such systems include a charged-particle-beam column with associated control apparatus for controlling column parameters (such as focus, x-astigmatism and y-astigmatism); a processor with associated memory, display and input/output devices; operating software including instruction sets for operation of the column and the processor to acquire, process and manipulate images of a sample. Suitable SEM and FIB systems are commercially available, for example, from Schlumberger Technologies, Inc., of San Jose, Calif.

Figure 13:
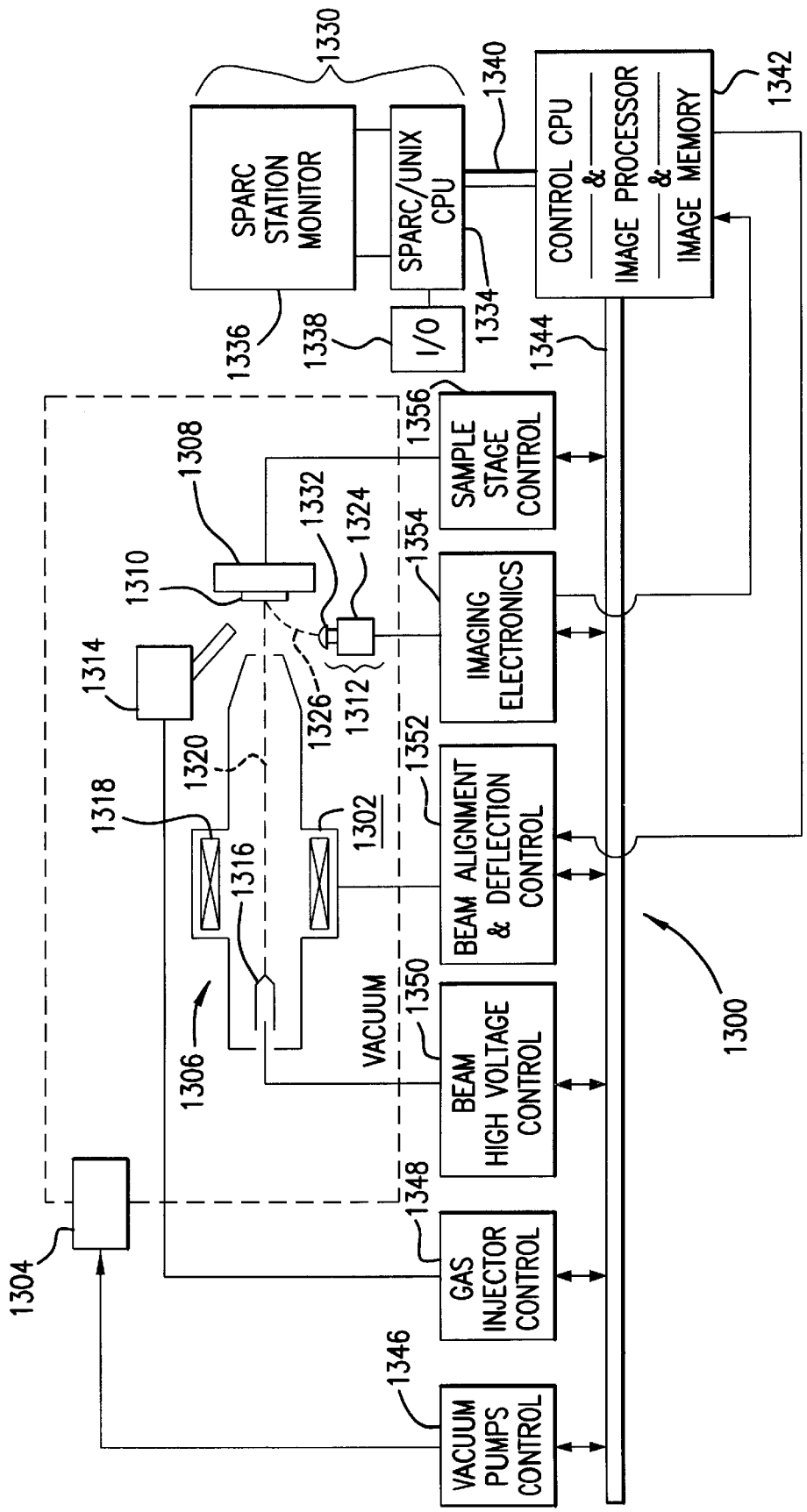
FIG. 13 is a block diagram of a charged-particle-beam system in accordance with the invention.

FIG. 13 shows in block diagram some elements of such a system 1300. A vacuum chamber 1302 evacuated by pumps 1304 encloses a charged-particle-beam column 1306, a specimen stage 1308 for holding a sample specimen 1310 such as an integrated-circuit device, a detector 1312, and (in the case of a FIB system) a gas injector 1314. Column 1306 includes a charged-particle (e.g., electron or ion) source 1316, and charged-particle-optical elements 1318 for controlling alignment and deflection of a charged-particle beam 1320. Detector 1312 may comprise a scintillator 1322 and a photo-multiplier tube 1324 for detecting secondary electrons 1326 emitted when charged-particle beam 1320 impinges on sample specimen 1310.

The system includes a workstation 1330 having a processor unit (CPU) 1334, a monitor 1336 and input/output (I/O) devices 1338 such as a keyboard and/or mouse. Workstation 1330 is linked by a bus 1340 to a system control unit 1342 comprising a control CPU, an image processor and image memory. System control unit 1342 communicates via a bus 1344 with a vacuum-pumps control 1346 for controlling vacuum pumps 1304, with gas injector control 1348 for controlling gas injector 1314 (in the case of a FIB system), with charged-particle-beam high-voltage control 1350 for controlling charged-particle source 1316, with charged-particle-beam alignment & deflection control 1352 for controlling charged-particle optical elements 1318, with imaging electronics 1354 which receive a detector signal from detector 1312, and with specimen-stage control 1356 for controlling specimen stage 1308 to position sample specimen 1310. System control unit 1342 preferably receives image information from imaging electronics 1354 and supplies beam control information to charged-particle-beam alignment and deflection control 1352. In operation, a specimen 1310 is placed in vacuum chamber 1302. Chamber 102 is evacuated. Under control of system control unit 1342, charged-particle beam 1320 is scanned over a selected region of the sample specimen to acquire an image of the selected region. Various techniques have been developed for using such systems in the diagnosis and (with FIB systems) repair of semiconductor integrated circuit devices.

Those of skill in the art will recognize that these and other modifications can be made within the spirit and scope of the invention as defined in the claims and their full scope of equivalents.

What is claimed is:

1. An automated method for setting parameters of a focused-particle-beam column to acquire a focused image of a sample, comprising:

a. Aligning the column,
   b. Acquiring an image of the sample having a focus-rotation center in the image,
   c. Setting image contrast, and
   d. Setting column focus.

2. The method of claim 1, wherein step b. comprises:
   acquiring an over-focused image of the sample;
   acquiring an under-focused image of the sample; and
   calculating a focus-rotation center from an image feature common to the over-focused image and the under-focused image.

3. The method of claim 2, wherein acquiring the over-focused image and acquiring the under-focused image comprise setting the column off-focus by a predetermined amount.

4. The method of claim 1, wherein the focused-particle-beam column comprises a scanning-electron-beam column.

5. The method of claim 1, wherein step d. comprises selecting a region of interest of the image around the focus-rotation center and filtering the region of interest with an edge-enhancement filter.

6. The method of claim 4, wherein filtering the region of interest with an edge-enhancement filter comprises applying a Sobel filter to pixels of the region of interest.

7. The method of claim 1, wherein step d. comprises selecting a region of interest of the image around the focus-rotation center; filtering the region of interest with an edge-enhancement filter; and calculating a value representing image sharpness within the region of interest.

8. The method of claim 7, wherein filtering the region of interest with an edge-enhancement filter comprises applying a Sobel filter to pixels of the region of interest.

9. The method of claim 7, wherein calculating a value representing image sharpness comprises applying a semi-Kurtosis matrix to pixels within the region of interest.

10. The method of claim 7, wherein step d. further comprises performing a Golden Section search over the region of interest to determine an optimum focus setting for the column.

11. The method of claim 1, wherein step d. comprises performing a Golden Section search over the region of interest to determine an optimum focus setting for the column.

12. The method of claim 1, further comprising:
e. correcting astigmatism of the column.

13. The method of claim 12, wherein step e. comprises selecting a region of interest of the image around the focus-rotation center and filtering the region of interest with an edge-enhancement filter.

14. The method of claim 13, wherein filtering the region of interest with an edge-enhancement filter comprises applying a Sobel filter to pixels of the region of interest.

15. The method of claim 12, wherein step e. comprises selecting a region of interest of the image around the focus-rotation center; filtering the region of interest with an edge-enhancement filter; and calculating a value representing degree of astigmatism within the region of interest.

16. The method of claim 15, wherein filtering the region of interest with an edge-enhancement filter comprises applying a Sobel filter to pixels of the region of interest.

17. The method of claim 15, wherein calculating a value representing degree of astigmatism comprises applying a semi-Kurtosis matrix to pixels within the region of interest.

18. The method of claim 15, wherein step e. further comprises performing a Golden Section search over the region of interest to determine an optimum astigmatism-correction setting for the column.

19. The method of claim 12, wherein step e. comprises performing a Golden Section search over the region of interest to determine an optimum astigmatism-correction setting for the column.

20. The method of claim 1, wherein step c. comprises: operating the column to acquire a low-contrast image; operating the column to acquire a high-contrast image; and counting saturation levels of pixels in the images.

21. The method of claim 20, further comprising the step of averaging the counting of saturation levels of pixels in the images.

22. The method of claim 20, wherein step c. further comprises applying a bisection method to set the image contrast at a level meeting pre-set criteria.

23. An imaging system having a focused-particle-beam column and control apparatus for setting parameters of the column to acquire a focused image of a sample by:

a. Aligning the column,
b. Acquiring an image of the sample having a focus-rotation center in the image,
c. Setting image contrast, and
d. Setting column focus.

24. The system of claim 23, wherein the control apparatus is adapted to acquire an image of the sample having a focus-rotation center in the image by:
acquiring an over-focused image of the sample;
acquiring an under-focused image of the sample; and
calculating a focus-rotation center from an image feature common to the over-focused image and the under-focused image.

25. The system of claim 24, wherein the control apparatus is adapted to acquire the acquire the over-focused image and to acquire the under-focused image comprise setting the column off-focus by a predetermined amount.

26. The system of claim 1, wherein the charged-particle-beam column comprises an electron-beam column.

27. The system of claim 23, wherein setting column focus comprises selecting a region of interest of the image around the focus-rotation center and filtering the region of interest with an edge-enhancement filter.

28. The system of claim 27, wherein filtering the region of interest with an edge-enhancement filter comprises applying a Sobel filter to pixels of the region of interest.

29. The system of claim 23, wherein setting image contrast comprises selecting a region of interest of the image around the focus-rotation center; filtering the region of interest with an edge-enhancement filter; and calculating a value representing goodness of focus within the region of interest.

30. The system of claim 29, wherein filtering the region of interest with an edge-enhancement filter comprises applying a Sobel filter to pixels of the region of interest.

31. The system of claim 29, wherein calculating a value representing goodness of focus comprises applying a semi-Kurtosis matrix to pixels within the region of interest.

32. The system of claim 29, wherein setting image contrast further comprises performing a Golden Section search over the region of interest to determine an optimum focus setting for the column.

33. The system of claim 23, wherein setting column focus comprises performing a Golden Section search over the region of interest to determine an optimum focus setting for the column.

34. The system of claim 23, wherein the control apparatus is further adapted for correcting astigmatism of the column.

35. The system of claim 34, wherein correcting astigmatism of the column comprises selecting a region of interest of the image around the focus-rotation center and filtering the region of interest with an edge-enhancement filter.

36. The system of claim 35, wherein filtering the region of interest with an edge-enhancement filter comprises applying a Sobel filter to pixels of the region of interest.

37. The system of claim 34, wherein correcting for astigmatism of the column comprises selecting a region of interest of the image around the focus-rotation center; filtering the region of interest with an edge-enhancement filter; and calculating a value representing degree of astigmatism within the region of interest.

38. The system of claim 37, wherein filtering the region of interest with an edge-enhancement filter comprises applying a Sobel filter to pixels of the region of interest.

39. The system of claim 37, wherein calculating a value representing degree of astigmatism comprises applying a semi-Kurtosis matrix to pixels within the region of interest.

40. The system of claim 37, wherein correcting for astigmatism of the column further comprises performing a Golden Section search over the region of interest to determine an optimum astigmatism-correction setting for the column.

41. The system of claim 37, wherein correcting for astigmatism of the column comprises performing a Golden Section search over the region of interest to determine an optimum astigmatism-correction setting for the column.

42. The system of claim 23, wherein setting image contrast comprises: operating the column to acquire a low-contrast image; operating the column to acquire a high-contrast image; counting saturation levels of pixels in the images.

43. The system of claim 42, wherein setting image contrast further comprises averaging the counting of saturation levels of pixels in the images.

44. The system of claim 42, wherein setting image contrast further comprises applying a bisection method to set the image contrast at a level meeting pre-set criteria.

\* \* \* \* \*